United States Patent [19]

Danz et al.

[11] 4,381,534
[45] Apr. 26, 1983

[54] PROCESS AND ARRANGEMENT FOR THE POLARIZATION OF SHAPED OBJECTS MADE FROM POLYMERS

[75] Inventors: Rudi Danz, Teltow; Wolfgang Stark, Kleinmachnow; Burkhard Elling, Potsdam; Christian Ruscher, Teltow-Seehof; Wolfgang Schwarz, Stahnsdorf, all of Fed. Rep. of Germany

[73] Assignee: Akademie der Wissenschaften der DDR, Berlin, German Democratic Rep.

[21] Appl. No.: 102,946

[22] Filed: Dec. 12, 1979

[30] Foreign Application Priority Data

Dec. 29, 1978 [DD] German Democratic Rep. ... 210275
Apr. 24, 1979 [DD] German Democratic Rep. ... 212341

[51] Int. Cl.³ ............................................. H01G 7/02
[52] U.S. Cl. ................................. 361/233; 29/592 E; 307/400
[58] Field of Search ............ 361/233; 307/400; 29/592 E

[56] References Cited

U.S. PATENT DOCUMENTS 2,928,032   3/1960   Daniel et al. .................. 361/233
3,950,659   4/1976   Dixon et al. ................. 361/233 X Primary Examiner—Harry E. Moose, Jr.
Attorney, Agent, or Firm—Michael J. Striker

[57] ABSTRACT

The invention relates to a method and an arrangement which are of importance in the polarization of shaped articles from polymers. The shaped articles from polymers, polarized by the method as per invention, are finding effective application in electroacoustic converters, piezoelectric switches and in proving electromagnetic radiation within a broad spectral zone.

It is possible to obtain by the method as per invention and, respectively, the arrangement as per invention, above-average values for polarization as well as for the piezoelectrical and pyroelectrical coefficients. The arrangement as described, and respectively, the method as described are characterized by the use of charge-limiting polarization capacitors.

5 Claims, 2 Drawing Figures

PROCESS AND ARRANGEMENT FOR THE POLARIZATION OF SHAPED OBJECTS MADE FROM POLYMERS

BACKGROUND OF THE INVENTION

The invention relates to a process and an arrangement which will enable an optimal polarization of shaped articles made from polymers. Shaped articles from polymers containing polar molecule groups in their primary structure, such as, f.i. polyvinylidene fluoride, polyvinyl fluoride, polyvinyl chloride, polyamide 11, 7, 55, or polyester, polyurethanes, polyurea, polyacrylonitrile, polycarbonates, are distinguished by piezoelectric and/or pyroelectric properties and nonlinear optical properties after having been treated by polarization in an electric field, and will, therefore, find an increasingly wide application as electroacoustic converters and also as temperature-measuring instruments. They are, f.i., used with success in microphones, loudspeakers, ultrasonic converters and for proving the presence of laser radiation.

A large number of descriptions of inventions and of publications have been devoted to the polarization of shaped articles from polymers (DE Letter of Disclosure No. 26 57 536, DE Letter of Disclosure No. 27 38 220, DE Letter of Disclosure No. 27 43 016; R. G. Kepler, R. A. Anderson: Ferroelectricity in polyvinylidene fluoride, J. Appl. Phys. 49 (1978) 3, p. 1232; M. H. Litt, G. Hsu, P. Basu: Pyroelectricity and piezoelectricity in nylon, 11. J. Appl. Phys. 48 (1977) 6, p. 2208). When polarizing shaped articles from polymers, it is essential to reach an optimal polarization with an expenditure that can be justified. It is of importance in this context to have strong electric fields (close to the puncturing field strength) act at increased temperatures on the shaped polymer article during the polarization process, without electrical punctures occurring therein.

In the descriptions of invention DE Letter of Disclosure No. 27 19 881, an arrangement and a process are described which are based upon the combined application of an electrical direct current field with an impulse-shaped electric field.

This method, and, respectively, the appropriate arrangement, have the disadvantage that, in the first place, they are of a complicated technical design (f.i. costly supply apparatus for the generation of voltage impulses, a complicated polarization arrangement) and, in the second place, they will generate only average pyroelectric coefficients. With the arrangement for the polarization of shaped polymer articles, as described in the DE Letter of Disclosure No. 27 19 881, polarization in strong electric fields requires an expensive technology with regard to apparatus. Three systems of apparatus are required for the generation of the polarizing voltage, wherein, f. i., the third apparatus system consists of two high-voltage sources and a complicated high-voltage proof control equipment. With another method (DE Letter of Disclosure No. 26 11 047, DE Publication of Specifications No. 26 11 047), it is already impossible in principle to polarize at high field strengths without causing the phenomena of punctures, and, apart from too limited a polarization, the relatively long polarizing times are of disadvantage. To overcome the disadvantages of the methods as known, it will be necessary to find a solution by which optimal polarization can be achieved within short times and by the use of simple technological means.

SUMMARY OF THE INVENTION

It is the object of the invention to develop a method and an arrangement allowing an effective polarization in an electric field, of shaped polymer articles provided at both sides with electrically conducting contacts. An optimal polarization with a high degree of reliability and reproducibility should, moreover, be ensured.

The arrangement according to the present invention and, respectively, the method should allow implementation of these objects with simple technical means.

According to the present invention, the problem is that of developing a method and an arrangement with which an optimal polarization of the shaped polymer articles provided at both sides with electrically conducting contacts can be achieved by using relatively large field strengths without electrical punctures being caused. The method according to the invention should be distinguished by allowing measuring of the polarization during the polarizing process in order to allow monitoring and control of its progress. The shaped articles made from polymers, polarized by the method according to the invention, or, respectively, the arrangement according to the invention, should have an above-average polarization and also have piezoelectric and/or pyroelectric coefficients of above-average magnitude.

This problem is solved by using in the polarization a high-voltage proof polarization capacitor of a capacitance $C_2$. The capacitance $C_2$ of the capacitor is selected in such a manner that at the beginning of polarization $C_2 > C_1$ (at least by one power of ten) will prevail, wherein $C_1$ represents the capacity of the shaped article of polymers provided at both sides with electrically conducting contacts (f.i. by metallization with aluminum). The polarization capacitor and the shaped article made from polymers are arranged in an electric circuit in such a manner that, given the condition $C_2 > C_1$ at the beginning of polarization, nearly the full voltage $U_G$, supplied from a direct-voltage source, the value of which should equal a field strength of minimum 4000 kVcm$^{-1}$, will be applied to the shaped article, causing orientation of the polar molecule groups in the direction of the electric field applied, particularly so with increased polarization temperatures $T_p$, $T_p$ preferably being $\frac{2}{3} T_m$ ($T_m$=melting temperature of the relevant shaped article made from polymers). At field strength of sufficient level and at sufficiently high temperatures, this will cause a nearly sudden rise in the capacitance $C_1$ of the shaped article and, at an optimal modulation of $C_2$ with the expected capacity increase of $C_1$ in the relevant electric circuit, this will bring about a rapid drop of $U_p$ (to) to a value $U_p$ (t) which is below the puncture limit, so that even at extremely high values of $U_p$ (t), no electric puncture can occur, since the extremely high polarizing voltage $U_p$ (to) as originally applied, will be applied only as long as required for polarization.

The novel features which are considered as characteristic for the invention are set forth in particular in the appended claims. The invention itself, however, both as to its construction and its method of operation, together with additional objects and advantages thereof, will be best understood from the following description of specific embodiments when read in conjunction with the accompanying drawing.

DESCRIPTION OF THE PREFERRED EMBODIMENTS

Figure 1:
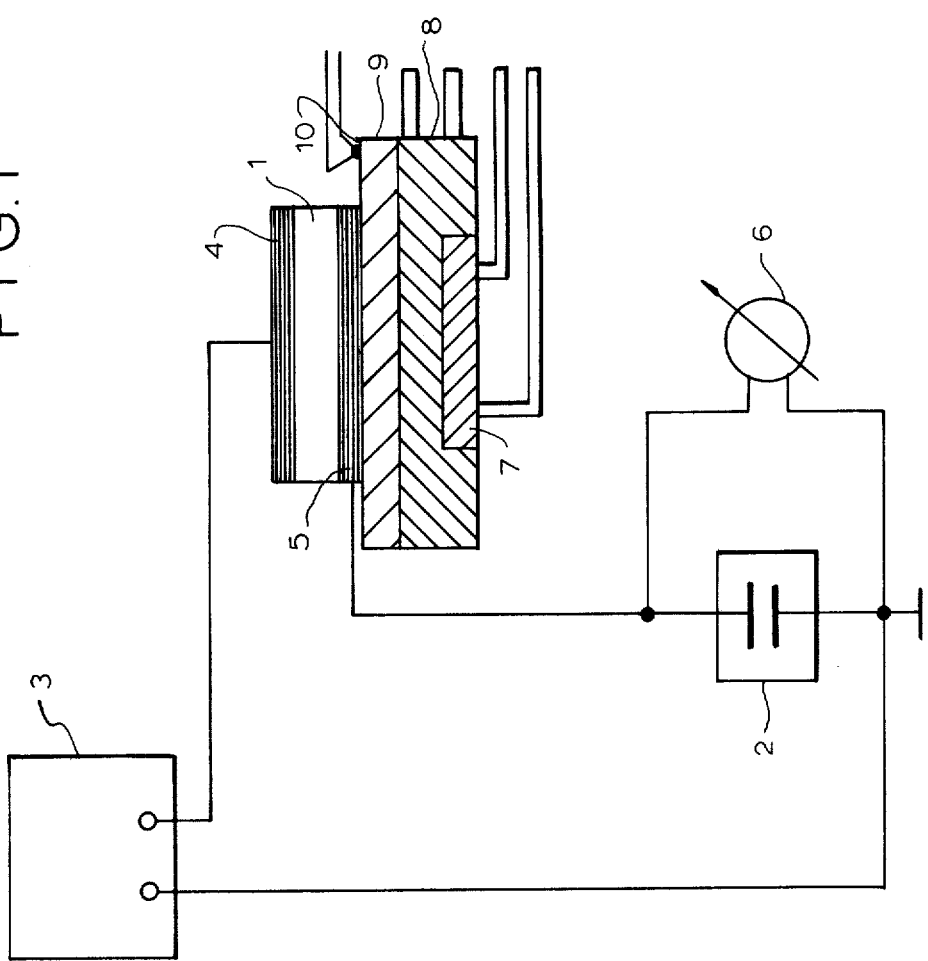
FIG. 1 represents a polarization arrangement according to the present invention.

In the first variant of the electric circuit used, the shaped article made from polymers 1, metallized, f.i., at both sides, is in an in-line circuit with a high-voltage proof polarization capacitor 2 as shown in FIG. 1, and is supplied by a direct voltage source 3 with the direct voltage $U_G$. Whilst the metallization 4 is connected with one pole to the direct voltage source 3, the metallization 5 is connected to the polarization capacitor 2. A high-ohm voltage meter 6 is used to measure the voltage $U_C$ applied to the polarization capacitor 2, the former being grounded on one side conjointly with the polarizing capacitor 2 and the direct-voltage source.

The shaped article made from polymers 1 is electrically insulated from the heating system 7 and the cooling 8 by a quartz or isin-glass plate 9. A thermocouple 10 is arranged on the quartz plate 9 to allow measuring of temperatures.

After the shaped article made from polymers 1 has been brought to the polarization temperature $T_p$ with the aid of the heating and measuring system 7 (radiant heating, high-frequency heating or resistance heating, heating by heat-transfer liquid), the direct voltage $U_G$ is applied to the system of polarization capacitor 2 - shaped article made from polymers 1, using herein the direct voltage source 3. Due to the in-line circuit of the shaped article made from polymers 1 and the polarization capacitor 2, as shown in FIG. 1, nearly the full voltage $U_G$ will be applied as polarization voltage $U_p$ (to) to the shaped article made from polymers 1 immediately after the direct voltage source 3 is switched on, since $C_2 > > C_1$ obtains in the initial state.

It $U_p$ (to) is of a sufficient magnitude (field strength minimum 4000 kVcm$^{-1}$) and $T_p$ is so selected that an adequately large movability of dipoles within the shaped article made from polymers 1 is ensured, ($T_p$ preferably above $\frac{2}{3}$ $T_m$), the relative dipole groups will orient themselves in the direction of the electric field as applied. By reason of this dipole orientation within the shaped article made from polymers 1, the capacitance $C_1$ will increase nearly suddenly due to the increase in polarization of the latter, and $C_1$ will reach a value located close to $C_2$, provided $C_2$ was selected optimal relative to the expected change in capacity in the shaped article made from polymers 1. This means, however, that the initial maximum polarizing voltage $U_p$ (to), after having effected an increase of polarization in the shaped article made from polymers 1, will partially transit within milliseconds onto the polarization capacitor 2, so that the extreme electric stress upon the shaped article made from polymers 1, occurring at the beginning of polarization, will be strongly reduced. If, e.g., the capacitance $C_1$ of the shaped article made from polymers 1 has reached the polarization capacitance $C_2$ of the polarization capacitor 2, an equal distribution of the voltage $U_p$ (to) will occur and only half of $U_p$ (to) will be applied as polarizing voltage $U_p$(t) to the shaped article made from polymers 1. In order to assure perfect modulation between the capacitance $C_2$ of the polarization capacitor 2 and the capacitance $C_1$ of the shaped article made from polymers 1, it will be of advantage to use a variable polarization capacitor 2.

Figure 2:
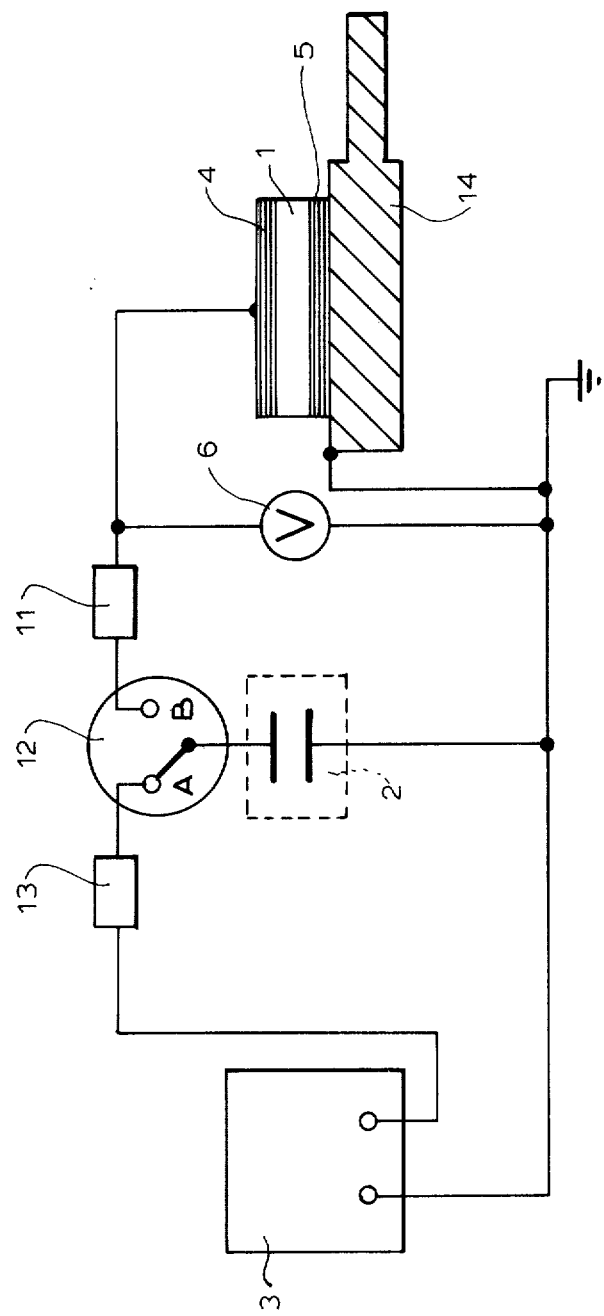
FIG. 2 is a variation of the arrangement, with one metallized side of the shaped polymer article contacting the ground potential.

In the circuit of the second variant, the shaped article made from polymers 1, metallized on both sides, will, according to FIG. 2, have one metallization 5 contacting the ground potential. The other metallization 4 is connected to the polarizing capacitor 2 over a resistor 11 and the movable tongue of a two-way switch 12 (position B). The polarizing capacitor 2 is, furthermore, connected with the direct-voltage source 3 via the two-way switch 12 (position A) and a resistance 13. A high-ohm voltage meter 6 is arranged in parallel to the shaped article made from polymers 1. The direct-voltage source 3, the polarization capacitor 2 and the voltage meter 6 are all connected on one side to the ground potential. The shaped article made from polymers 1 is in close thermal contact with the heating system 14.

After the shaped article made from polymers 1 has been heated to the polarizing temperature $T_p$ by using the preheating and measuring system 14, the polarizing capacitor 2 is charged to the voltage $U_G$ by the direct-voltage source 3 via the resistor 13, (two-way switch in position A). For polarization, the two-way switch 12 is brought into position B, wherein the polarizing capacitor 2 is isolated from the direct-voltage source 3 and switched, via the in-line resistor 11, in parallel with the shaped article made from polymers 1, as shown in FIG. 2. By the parallel arrangement of the shaped article made from polymers 1 with the polarization capacitor 2, nearly the full voltage $U_G$ is applied at the moment of switching to the shaped article from polymers as $U_p$ (to), since $C_2 > > C_1$ obtains the initial state. If $U_p$(to) is of sufficient value (field strength minimum 4000 kVcm$^{-1}$) and $T_p$ is so selected that a sufficiently large dipole movability is assured within the shaped article made from polymers 1 ($T_p$ preferably above $\frac{2}{3}$ $T_m$), the respective dipole groups will orient themselves in the direction of the electric field as applied.

This dipole orientation, like the polarization with the first variant of the circuit, will cause a nearly sudden increase of $C_1$, in consequence whereof the initial maximum polarization voltage $U_p$ (to) at the shaped article made from polymers 1, will quickly drop to a value $U_p$ (to) that is below the puncturing limit.

It is possible with the method according to the invention, in its first (FIG. 1) as well as second circuit variant (FIG. 2), to effect polarization at high temperatures with field strengths that are at least twice as high as in the methods known hitherto. With optimal modulation between $C_1$ and $C_2$, the polarization capacitor 2 will, in the circuit arrangements as given, limit the charge at the shaped article made from polymers 1 in such a manner, that the very high polarization voltage $U_p$ (to) will be applied to the shaped article made from polymers 1 only for an optimally brief time and will drop below the puncturing voltage at an adequately fast rate. The specifity of this method allows polarization at above-average magnitudes of field strength, even in the vicinity of $T_m$. An interaction will take place between the polarizing capacitor 2 and the shaped article made from polymers 1, causing the maximum polarization voltage $U_p$ (to) at the shaped article made from polymers 1 to drop at an optimal rate relative to time. The greater is $U_p$ (to)—with a suitably selected $T_p$—the faster the rise in polarization in the shaped article from polymers 1, and the shorter the time during which $U_p$ (to) is applied to the shaped article made from polymers 1. It thus becomes possible to use at temperatures $t_p$ such polarizing voltages at which electrical punctures would otherwise occur with certainty. If polarization is made considerably above $\frac{1}{2} T_m$, it will be favorable with the method according to the invention to effect rapid cooling of the shaped article made from polymers 1 while maintaining the voltage $U_p(t)$.

The voltage meter 6 shown in FIG. 1 and FIG. 2, is intended to indicate the course of the polarization voltage $U_p(t)$ during polarization. The degree of polarization of the shaped article made from polymers 1 can be determined from the final value of $U_p(t)$ if the capacitance $C_2$ of the polarization capacitor is known. This means that the polarization process can thus be regulated and the polarization regimen can be influenced in such a manner that a predetermined polarization is obtained in the shaped article made from polymers 1. Short circuits that may occur in the shaped article made from polymers 1 due to defects in the material will, on the other hand, be indicated by an abrupt discharge from the shaped article made from polymers 1. The process of polarization may then be interrupted immediately and the sample separated. Subsequent checking of the polarized shaped articles made from polymers to a further extent will not be necessary since the indicated final value of $U_p(t)$ allows an immediate determination of piezo and pyro-electricity. Measuring of $U_p(t)$ is to be made in the high-ohm range in order to avoid a discharge of the system of shaped article made from polymers 1/polarization capacitor 2, through the measuring instrument. The in-line resistor 11 shown in FIG. 2 allows for varying of the rising time of $U_p(t_o)$ relative to an optimization of the polarization process.

The method according to the invention and, respectively, the arrangement have the advantage that polarization at high field strengths may be made without rupturing. The polarized shaped articles made from polymers are distinguished by above-average values for polarizations as well as for the piezoelectric and pyroelectric coefficients.

The polarization time is in the range of a few seconds. The method according to the invention and, respectively, the arrangement are effectively usable preferably with shaped articles made from polymer film or foil that have polar molecule groups in their primary structure.

Examples of such polymers includes halogenated vinyl polymers, polyesters and polyamides, polyurethanes, polyurea as well as polyacrylonitrile and polycarbonates.

EXAMPLE 1

(Circuit variant 1)

Polarization of fluor polymers:

An uniaxially oriented polyvinylidenefluoride film of a thickness of 0.01 mm, predominantly present as modification I, is metallized on both sides by vapor deposition of aluminum (1.0 cm$^2$ circular area) and brought to a polarization temperature of 140° C. The polarization capacitor used for polarization has a capacitance of 10 nF, which is more than one magnitude above the capacitance of the untreated polymer film. Using a direct-voltage source, a direct voltage $U_G=5$ kV is applied to the in-line circuit polarizing capacitor/polymer film. Immediately after switching on $U_G$, nearly the full value of $U_G$ is applied to the polymer film as polarizing voltage, causing the orientation of the dipoles. The rapid rise of the capacity of the polymer film caused thereby will provide a redistribution of the voltage $U_p(t_o)$ upon the polarization capacitor, so that only 2.5 kV will be applied to the polymer film after polarization has been completed. After completion of polarization, the polymer film is cooled to room temperature, the voltage being maintained therein.

After the polarization process as described, the polyvinylidenefluoride film will have been given a piezoelectric coefficient of 60 pC/N and a pyroelectric coefficient of 8 nC/cm$^2$K.

In polarization of a biaxially oriented polyvinylidenefluoride film (metallized area 0.8 cm$^2$) of 0.006 mm thickness, a direct voltage $U_G=2.5$ kV is applied at a temperature of 130° C., using the same polarization capacitor. Polarization without electrical puncture can be effected herein as well (piezoelectric coefficient 30 pC/N, pyroelectric coefficient 4 nC/cm$^2$K).

Polarization of polyvinylfluoride foil of 0.015 mm thickness, (metallized area 1 cm$^2$) requires a polarization capacitor of a capacitance of 1 nF. The polarization temperature is 110° C. A direct voltage $U_G=6$ kV is used. In this embodiment, a pyroelectric coefficient of 2 nC/cm$^2$K is obtained as result of the polarization.

EXAMPLE 2

(Circuit Variant 1)

Polarization of polyacrylonitrile:

Polarization of polyacrylinitrile proceeds from highly orientated films (uniaxial orientation) 0.01 mm thick (metallized area 1 cm$^2$). In this instance, the capacitance of the polarization capacitor is 5 nF, the voltage $U_G=5$ kV. Polarization is made at 120° C., by the regimen as already described. The pyroelectric coefficient obtained as result is 4 nC/cm$^2$K.

EXAMPLE 3

(Circuit variant 1)

Polarization of polyamides:

An uniaxial polyamide film based on polyamide 11, 0.010 mm thick, is metallized with aluminum on both sides (metallized area 1 cm$^2$). The polarization temperature is 120° C. and a voltage of $U_G=5$ kV is applied. The capacitance of the polarization capacitor is 5 nF. The film is polarized for 5 minutes and subsequently cooled to room temperature in the electric field. The same polarization regimen was also used in the polarization of films (thickness 0.010 mm) on the basis of polyamide 7 and polyamide 55 obtained from a 2% solution of formic acid. The films were stretched four-fold before polarization and subsequently also metallized with aluminum (area 0.8 cm$^2$). The pyroelectric coefficients amount to 2 nC/cm$^2$K for polyamide 11, and 3 nC/cm$^2$K for polyamide 55 and 7.

EXAMPLE 4

(Circuit variant 2)

Polarization of polyvinylidenefluoride:

An uniaxial oriented polyvinylidenefluoride film, 0.012 mm thick and predominantly present in the modification I, is metallized on both sides by vapor deposition of aluminum (1.0 cm$^2$ circular area) and brought to a polarization temperature of 120° C. The polarization capacitor, in electric arrangement with the polymer film as per FIG. 2, has a capacity of 10 nF which is higher than the capacity of the initial sample by more than one order of magnitude. After the polarizing capacitor has been charged, by using the direct-voltage source, to the voltage $U_G=5$ kV, actuation of the two-way switch will electrically connect the polarization capacitor with the polymer film and simultaneously isolate the former from the direct-voltage source. The in-line resistance between polymer film and polarization capacitor is selected at 1 M$\Omega$.

As soon as the electric connection between polarization capacitor and polymer film has been made, the polarization voltage $U_p$ (to) which is only a little below the value of $U_G$, is applied to the polymer film and will cause the orientation of the dipoles. The capacitance of the polarization capacitors in parallel circuit with the polymer film is 4 nF, the direct voltage applied, $U_G=4$ kV. Polarization is made at 70° C. by the regimen as already described. The value obtained for the piezoelectric coefficient is 60 pC/N and the value for the pyroelectric coefficient is 1 nC/cm$^2$K.

It will be understood that each of the elements described above, or two or more together, may also find a useful application in other types of polarizations differing from the types described above.

While the invention has been illustrated and described as embodied in a process and arrangement for the polarization of shaped objects made from polymers, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. Method for polarizing at high field strengths, shaped articles made from polymers provided at both sides with electrically conducting contacts, characterized by the polarization voltage $U_p(t)$ corresponding at least to an initial field strength of 4000 kVcm$^{-1}$ which is applied to the shaped articles made from polymers having with their contacts a capacity $C_1$ at temperatures preferably above ⅔ the melting temperature of the shaped articles, by means of variable, high-voltage resistance, charge-limiting polarization capacitors of a capacity $C_2$, wherein $C_2>>C_1$ is valid as initial state, and wherein $C_2$ is selected in such a way that the initial maximum polarization voltage $U_p(t_o)$ is applied only momentarily to the shaped article and will drop after completed polarization to a value $U_p(t)$ which will amount to approximately one half of $U_p(t_o)$.

2. Method according to claim 1, further comprising initially preparing said shaped articles from polymers in the form of foil, wherein said polymers have polar molecule groups and are selected from the group consisting of halogenated vinyl polymers, polyesters, polyamides, polyurethanes, polyureas, polyacrylonitrile and polycarbonates.

3. Method according to claim 1 or 2, characterized by regulation of polarization being effected by the voltage measured in parallel with the polarization capacitor.

4. Arrangement for the polarization of shaped articles made from polymers, said articles being provided at both sides with electrically conducting contacts, comprising an in-line electric circuit of a direct-voltage source; polarization means; and said shaped article; one of said contacts of said article connected by a first conductor to one pole of said source, a second of said contacts of said article connected by a second conductor to one side of said polarization means, and a second pole of said source connected by a third conductor to a second side of said polarization means, said third conductor having an in-line resistor; heating means in close thermal contact with but electrically insulated by insulation means from said article; and temperature measuring means arranged on said insulation means.

5. The arrangement according to claim 4, further comprising a fourth conductor bridging said first and said second conductors; a two-way switch disposed in said third conductor, one position of said two-way switch forming an in-line circuit between said source and said polarization means by way of said fourth conductor, a second position of said two-way switch forming an in-line circuit between said polarization means and said article by way of a fifth conductor connected between said second position of said two-way switch and said second conductor, said fifth conductor having an in-line resistor; and a ground connection to said fourth conductor.

* * * * *